United States Patent [19]
Jenets et al.

[11] Patent Number: 5,537,285
[45] Date of Patent: Jul. 16, 1996

[54] DIGITAL OUTPUT CONTROL DEVICE AND METHOD FOR OPERATING

[75] Inventors: Robert J. Jenets, North Huntingdon; Craig A. Miller, Pittsburgh, both of Pa.

[73] Assignee: Westinghouse Air Brake Company, Wilmerding, Pa.

[21] Appl. No.: 340,235

[22] Filed: Nov. 16, 1994

[51] Int. Cl.⁶ .................................................. H02H 3/00
[52] U.S. Cl. ...................... 361/100; 361/93; 361/115; 307/113
[58] Field of Search ........................ 361/91, 93, 115, 361/100; 307/113

[56] References Cited

U.S. PATENT DOCUMENTS

| | | | |
|---|---|---|---|
| 3,715,579 | 2/1973 | Eblovi | 246/187 |
| 3,794,834 | 2/1974 | Auer et al. | 340/146.1 C |
| 3,805,056 | 4/1974 | Birkin | 246/187 |
| 5,016,840 | 5/1991 | Bezos | 246/187 |
| 5,200,878 | 4/1993 | Sasagawa | 361/93 |
| 5,347,166 | 9/1994 | Schauder | 307/113 |

Primary Examiner—Jeffrey A. Gaffin
Assistant Examiner—Stephen W. Jackson
Attorney, Agent, or Firm—James Ray & Associates

[57] ABSTRACT

Apparatus and method are presented for a solid state relay module suitable for accepting low-level digital signals from a digital computer, and for providing on/off control of heavy electrical loads. The relay and its methods are intended for electrically hostile environments such that the relay may be exposed to spurious high voltages either on its input or on its load circuit. This relay and its methods are particularly intended for use in a locomotive throttle controller. The relay accepts low-level digital signals from a central processor computer in the throttle controller, and provide high-power digital signals to the trainlines which control the engine of the locomotive.

16 Claims, 2 Drawing Sheets

DIGITAL OUTPUT CONTROL DEVICE AND METHOD FOR OPERATING

CROSS REFERENCE TO RELATED APPLICATIONS

The invention taught in this patent application is closely related to the inventions taught in the following co-pending patent applications: Electronically Controlled Locomotive Throttle Controller Including Remote Multiple Unit Throttle Control; Method And Apparatus For Determining And Encoding The Position Of A Reverser Handle On A Locomotive Control Stand; Method And Apparatus For Feedback Of Trainline Status To The Central Processor Of A Locomotive Throttle Controller; Apparatus For Interlocking Throttle, Dynamic Brake And Reverser Handles On A Control Stand Of A Railway Locomotive; Method Of Performing Diagnostics On An Electronically Controlled Railway Locomotive Throttle Controller; Method Of Operating A Locomotive Mounted Throttle Controller Between Two Modes Of Operation Including A Transition Between Such Two Modes; An Apparatus For And A Method Of Generating An Analog Signal For Control Of Dynamic Braking; An Apparatus For Feedback Of An Analog Signal Used To Monitor and/or Control Dynamic Braking And Method Of Operating; An Apparatus To Enable Controlling A Throttle Controller From A Remote Host; Apparatus For Interlocking Reverser Handle On A Control Stand Of A Railway Locomotive; and, Apparatus For Determining The Absolute Position Of Throttle, Dynamic Brake And Reverser Handles On A Locomotive Control Stand. Each of the above-referenced patent applications are being filed concurrently herewith and are assigned to the assignee of this invention. Additionally, the teachings of each of these patent applications is incorporated herein by reference thereto.

FIELD OF THE INVENTION

This invention applies most broadly to the field of electrical relays, and more narrowly to a relay used in an electronically operated throttle controller for a locomotive. The requirement, for the locomotive application, is for a relay for driving high-voltage, high-power digital electrical signals on the trainlines of the locomotive.

BACKGROUND OF THE INVENTION

Prior to the present invention, it is generally well known in the railway industry, that the throttle controller assemblies used in a railway type locomotive are almost exclusively of the mechanical type. These mechanical type locomotive throttle controller assemblies have normally utilized a number of mechanical devices in order to achieve actuation of the necessary microswitches and/or contacts. It is equally well known, for example, that cams are used extensively in this application in order to achieve the required actuation of the various microswitches and/or contacts disposed in the mechanical type throttle controller.

Such mechanical type throttle controllers which are presently being used on railway locomotives exhibit a number of relatively serious drawbacks and/or other limitations. These limitations have become more pronounced as the length of freight trains has grown in modern railroading, because the use of more and more locomotives are now required in a train consist in order to pull and/or push the added loads being hauled. For example, these mechanical type throttle controllers utilize either microswitches or contacts to control the voltage that is being applied to the trainline. Furthermore, there is no provision in these prior art mechanical throttle controllers for possible shut down of the system in the event of an output over current.

Additionally, these mechanical type throttle controllers are not equipped to provide the operator of the locomotive with any important feedback information and, consequently, they may not recognize a potential failure situation.

The prior art mechanical throttle controllers normally provide labels over each of the mechanical handles to convey only the position of the handle to the locomotive operator. However, these mechanical type throttle controllers are not equipped to display certain other relevant information, such as various diagnostic information, status information and/or warning type messages.

Furthermore, in a situation where it is either desirable or necessary to provide the required throttle control from a remote host over the communication lines, the currently used mechanical type throttle controllers require that a number of additional relays be used.

These are so bulky that when a consist of locomotives are operated in a slave mode, based on radio signals from a remote lead locomotive, it is necessary to provide a dedicated boxcar to contain relays used for control of trainlines of the slave locomotives.

It can be seen from the above discussion of the prior art mechanical type throttle controller assemblies, presently used in the railroad industry, that there is an unfilled need which exists in the modern railroad industry for an improved railway locomotive type throttle controller assembly which will provide enhanced performance capability, additional functions which are not possible to accomplish with the prior art mechanical type throttle controllers and more consistent reliability. It is evident that this need has been addressed by each of the present invention and the closely related additional inventions which are being filed concurrently herewith.

SUMMARY OF THE INVENTION

The need which the present invention addresses is for a relay having the following characteristics:

(1) It is capable of on/off switching of a high-voltage, high-power load.

(2) It consumes little power even when it is supplying a heavy current to a high-power load.

(3) It is compact in size.

(4) The controlling signal for the relay is a relatively low-voltage, low-power signal which may originate in a digital computer.

(5) The relay is designed to operate in an electrically hostile environment, in which the load may become short-circuited to ground, or to a high voltage, and in which the input signal may contain high-voltage spikes and other transients.

For the railway application, this relay is intended to drive digital signals on trainlines which control throttle and reverse of a locomotive, as well as some other functions such as sand used to increase traction.

The present invention provides method and apparatus for utilizing certain types of high-power semiconductor devices for this application. Specifically, the type of device used is a MOS-Controlled Thyristor. Other devices may be used with this invention if they function as equivalents, for the purpose of this invention.

The MOS-Controlled Thyristor has the following desirable features which provide incentive for using it in this application.

(1) It has low resistance between a terminal for admitting a load current, and a terminal for outputting a load current. It can also carry a heavy load current.

(2) It can be switched on or off, even when it supplies power to a high-voltage, high-power load. For a preferred embodiment in a locomotive throttle controller, the voltage supplied may be 74 Volts, and the electrical power delivered to a trainline may be in excess of 1,000 Watts.

(3) It can be turned on or off by a low-voltage, low-power signal applied to a high-impedance control terminal.

The MOS-Controlled Thyristor, has some disadvantages which this invention provides for:

(1) It can easily be damaged by out-of-range voltages applied to its control terminal. Due to the high impedance of its control terminal, it can even be damaged by electrostatic discharges during handling, when it is not in a circuit.

(2) Although when it is in its OFF state, it can withstand high voltages in the forward direction, without conducting or being harmed, it cannot withstand high voltages in the reverse direction.

(2) Although when it is in its ON state, it carries high load currents, it can nevertheless be damaged by an out-of range load current.

The present invention provides method and apparatus for utilizing a MOS-Controlled Thyristor, or an equivalent electronic element in a relay for the application cited.

This invention provides method and apparatus for overcoming the disadvantages of the MOS-Controlled Thyristor, and making it possible to use a MOS-Controlled Thyristor or equivalent electronic element in a high-power relay circuit in a hostile electrical environment.

Further understanding of the present invention in its application to locomotive throttle controllers can be obtained from the above-referenced application entitled "Method And Apparatus For Feedback Of Trainline Status To The Central Processor Of A Locomotive Throttle Controller".

The present invention accepts digital signals from the central processor computer and drives high-power digital signals on the trainlines. The referenced application functions reciprocally to the present invention. It samples the voltages applied to the trainlines, and transmits information indicative of the trainline status back to the central processor.

OBJECTS OF THE INVENTION

It is one of the primary objects of the present invention to provide a solid state relay module which uses a high-power semiconductor device for on/off switching of a high-voltage, high power load current to an electrical load in an electrical system which is "electrically hostile", that is to say, which may expose equipment to damaging voltages. An additional aspect of this object is that this relay module be controllable by a low-voltage, low-power digital signal. It is a further aspect of this object that the relay be equipped with overcurrent protection such that in the event that the output current from the high-power semiconductor device exceeds an allowable limit, the capability of the semiconductor device to be turned off when under load is used to turn it off, and hence protect it from damage.

A second object of this invention is to provide a solid state relay module, which can recover function after a brief overcurrent, and reset itself so it will continue to control the load current, based on the controlling low-voltage, low power input signal. To this end, a timing circuit is employed, which begins timing in the event that the circuit has turned itself off due to output overcurrent. After a predetermined time has elapsed, it then turns itself on again and if the output current is acceptable, it remains functional. A further object is to provide a relay in which the timer is a capacitor.

An additional object is to provide a solid state relay module in which the high-power semiconductor device is protected from excessive reverse voltages, which would tend to reverse the direction of the load current and damage the semiconductor device. To accomplish this object, a semiconductor diode is placed in series with the output of the high-power semiconductor device to block currents which would otherwise be caused by reverse voltages coming to it from the load circuit.

An additional object is to provide a solid state relay module in which the input circuit is protected from high voltage transients by an optical coupler which admits low-level input signals, while protecting the circuit from high-voltage transients.

An additional object is to provide a solid state relay module in which the control terminal of the high-power semiconductor device is protected from out-of range voltages. This is done by generating the control signals in a circuit which floats with the anode of the semiconductor, which is the terminal through which the load current is admitted.

An additional object is to provide a solid state relay module in which a voltage-limiting diode is used to protect the control electrode of the high-power semiconductor from excessive voltages.

An additional object of this invention is to provide a solid state relay module which employs a MOS-Controlled Thyristor.

An additional object of this invention is to provide a solid state relay module with an indicator to indicate whether power is applied to the electrical load.

An additional object is to provide a digital output stage for a locomotive throttle controller which employs the solid state relay module described above.

A further object is to provide a method of switching a high-voltage, high-power load current to an electrical load based on a low-voltage, low power digital signal, while protecting equipment from high-voltage spikes. This method includes the steps of passing the digital signal through an optical isolator, and thence to the control terminal of a MOS-Controlled Thyristor (hereinafter referred to as an MCT); applying a high voltage to the anode of the MCT and obtaining a load current from the cathode of the MCT.

A further object is to protect the MCT from damage due to reverse voltage transients in its load circuit, and to limit the voltage applied to its control terminal to prevent out-of-range voltages which would damage the MCT.

It is a further object to prevent out-of-range voltages on the control terminal of the MCT by using a circuit which floats in relation to the anode of the MCT.

A further object is to prevent out-of-range voltages on the control terminal of the MCT by using a voltage-limiting diode.

An additional object is to protect the MCT from excessive load currents by sensing the load current and using it to provide a signal which overrides its input signal, and turns the MCT off.

An additional object is to provide a method of driving a digital signal on the trainlines of a locomotive throttle controller by using an MCT.

BRIEF DESCRIPTION OF THE PRESENTLY PREFERRED EMBODIMENT

Figure 1A:
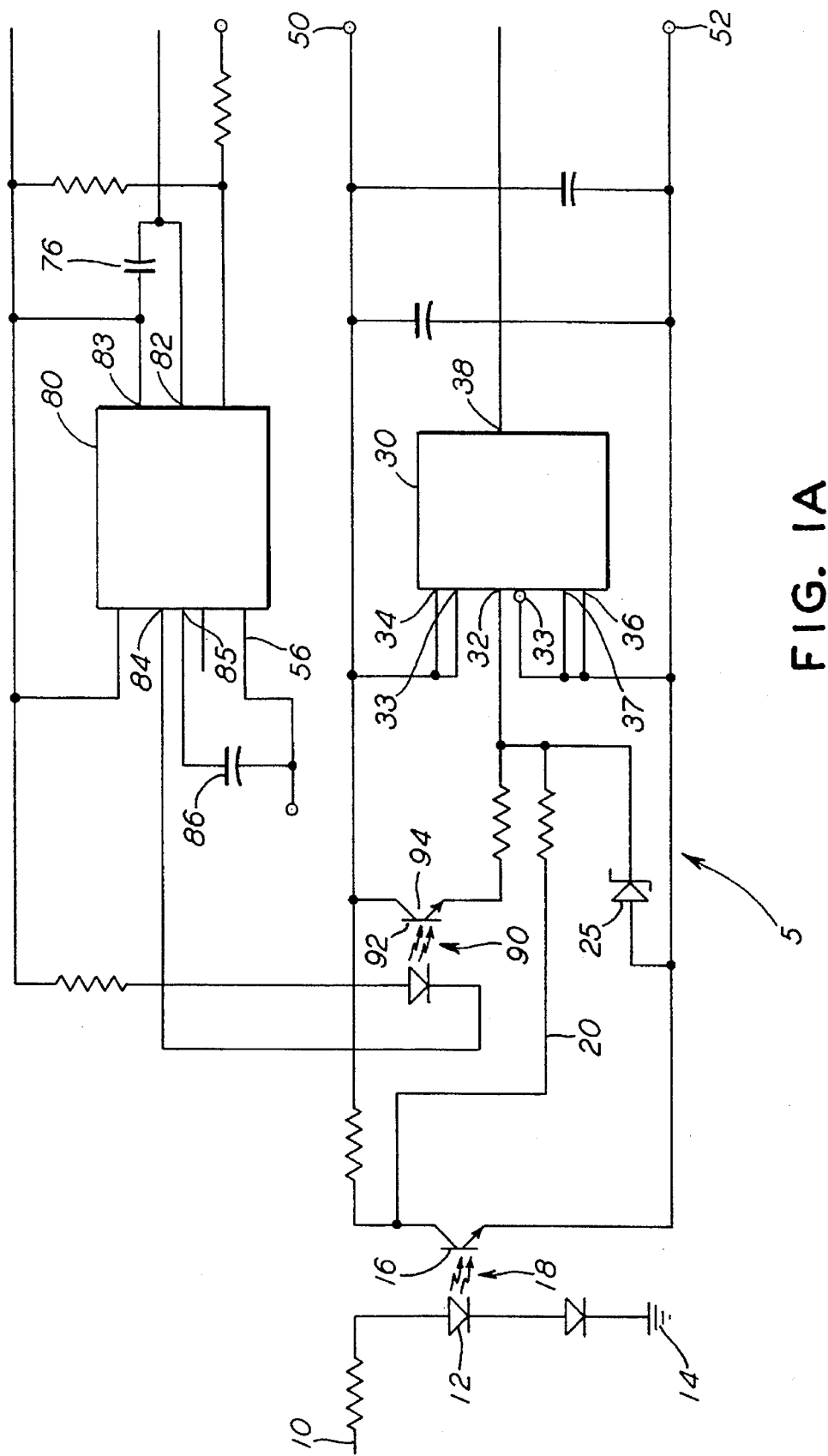
FIG. 1 is a circuit diagram which illustrates a presently preferred embodiment of this invention.
Figure 1B:
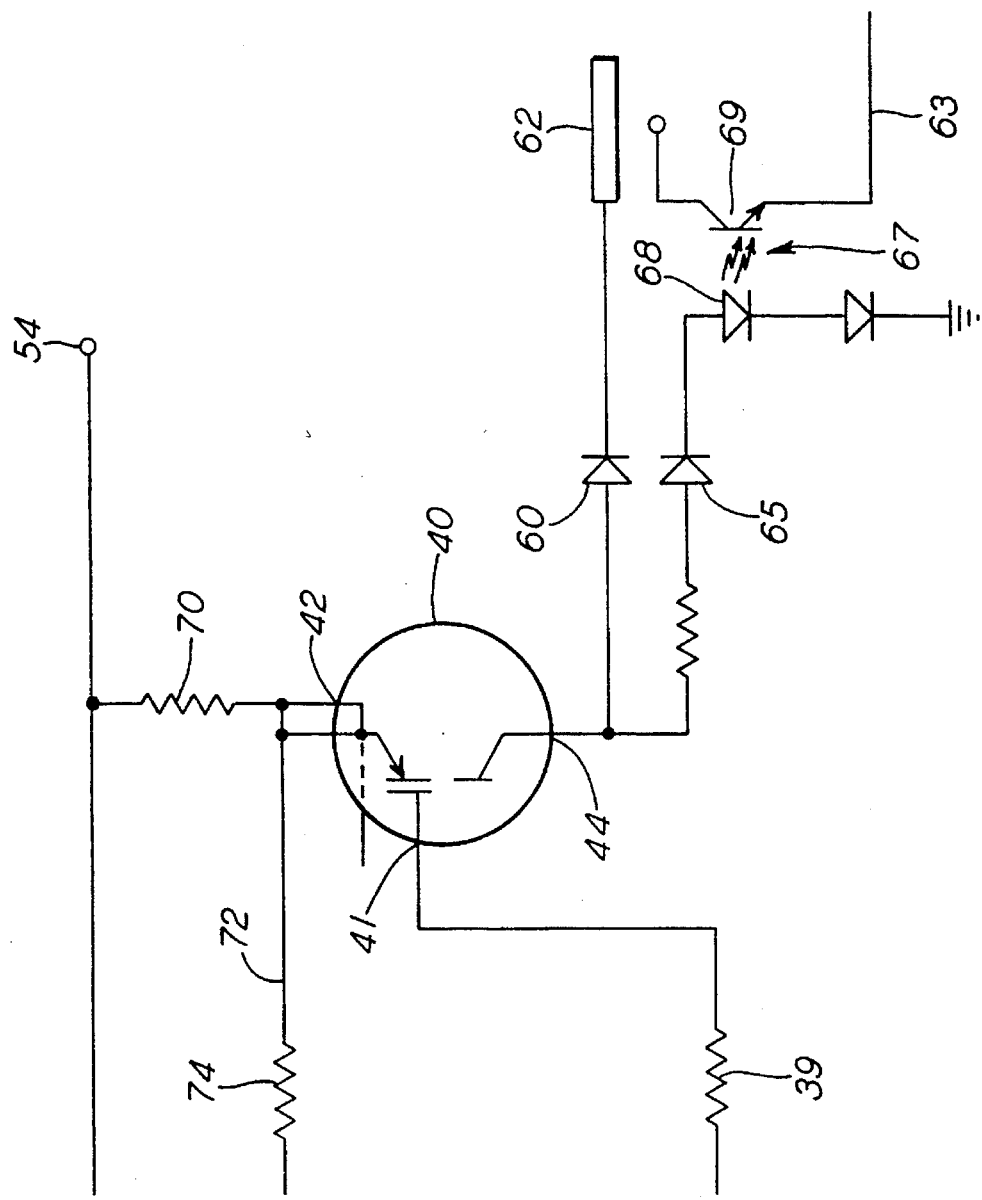

Referring now to FIG. 1, the input signal enters the solid state relay module, indicated generally as 5 through line 10. When the input signal is high, it causes a current to flow through the photodiode side 12 of an optical isolator 18 on the way to ground 14. In this case, the voltage on line 20 goes to a relatively negative value which is applied to an integrated circuit 30, which is a UC3705, through its non-inverting input, 32.

This integrated circuit, 30, also has an inverting input, 33, which is kept always at a relatively low voltage by its connection to VA− at node 52. The integrated circuit, 30 also has ground terminals 36 and 37 which are likewise held at the relatively low voltage, VA−. This integrated circuit, 30 is also connected to a relatively positive voltage source, 50 which is VA+ through connections 33 and 34. These serve as its power input.

When, as discussed above, the voltage of pin 32, the noninverting input of integrated circuit 30, goes negative, it causes a negative voltage to appear on the output terminal, 38. In fact, the voltage appearing at terminal 38 is approximately equal to VA−, the voltage at node 52.

For the case of the opposite signal on line 10, if this signal is low, the current through the photoemitter, 12 of optical isolator 18 is turned off, turning off the light, so the photoconductor side, 16 of the optical isolator, 18 ceases to conduct. This causes a relatively positive voltage to be applied to the non-inverting input, 32 of the integrated circuit, 30 and cause a positive voltage on its output, 38. In fact, this positive voltage is very close to the value VA+ which is the voltage at Node 50.

The voltage obtained from the integrated circuit, 30 at its output terminal 38 is applied through resistor 39 to the gate 41 of the MOS-Controlled Thyristor, 40.

The anode 42 of the MCT 40 is connected to a high voltage (74 Volts) at node 54 through resistor 70, and the cathode 44 of MCT 40 is connected to the trainline 62 through diode 60.

External circuitry (not shown) provides voltages VA+ and VA− which are referenced to the voltage at node 54, the high-voltage line which is nominally 74 volts. External circuitry provides that VA− is approximately 10 Volts negative relative to node 54, and VA+ is approximately 18 Volts positive in relation to Node 54.

These values, for VA− and VA+ are the turn-on and turn-off signals for MCT 40. The reason that these are referenced to the voltage of Node 54 is that this high voltage can swing through a wide range of voltages, and if the signal applied to the input terminal 41 of the MCT 40 had an absolute reference, the gate to anode voltage could be exceeded, and the MCT would be damaged.

The diode, 60, which is connected between the MCT cathode, 44 and the trainline, 62 serves to block high reverse voltages which might come back on the trainline, 62, and damage the MCT, 40.

Protection of the relay 5 from input transients is accomplished by the optical isolator 18, and by the voltage-limiting diode 25. This diode conducts if the voltage across it exceeds a known value, and serves to limit the effect of input voltage transients.

The circuitry discussed so far provides for the basic functioning of the relay module, 5. The remaining circuitry is for protecting it from excess load currents.

The resistor, 70 is a low-value resistor used for sensing the load current which enters the MCT at its anode, 42, and exits at its cathode, 44. The voltage drop through this resistor is applied through resistor 74 to the input 82 of integrated circuit, 80. Time changes in this voltage are applied through capacitor 76 to the terminal 83 of integrated circuit 80. The capacitor 76 has a function of delaying response of the integrated Circuit 80 to a transient voltage signal.

When an excessive anode current is indicated at the input 82 of integrated circuit 80, its status line at terminal 84 goes low. This permits a current to flow through the photoemitter side, 92 of optical isolator, 90. In that event, the photoconductor side 94 of optical isolator 90 conducts, and a positive voltage signal, close to VA+ is applied to the terminal 8 of integrated circuit, 30. This causes a positive voltage (VA+ to appear at its output, terminal 38, and this is applied to the gate, 41 of the MCT 40. This turns the MCT off, and protects it from harm due to the excessive current.

An additional function is provided by the capacitor 86. If the integrated circuit, 80 is turned off due to a sensed overcurrent, the capacitor begins charging, having a voltage rise rate which depends on the value of the capacitance of 86. When its voltage attains a predetermined amount, it turns the integrated circuit back on and the capacitor 86 is discharged. The system can then make an attempt at normal functioning, with output currents dependent on the input signals from line 10. If, again, there is an overcurrent, the integrated circuit 80 again responds, with a low voltage at the output 84, which through the sequence discussed above, turns off the MCT 40.

In the preferred embodiment, for a locomotive throttle controller, if repeated attempts at normal function result in overcurrent, this information is sensed in the central processor, and based on software logic, the system may be shut off.

An additional feature of this relay is the photodiode, 65. This provides a visible indication of the voltage applied to the trainline, 62, through the diode, 60. An additional photodiode, 68 is the emitter portion of an optical isolator 67. If this photoemitter is turned on, the photoconductor side 69 of optical isolator, 67 is turned on and it energizes a signal on the feedback line, 63. The signal on this feedback line is processed by the reciprocal invention cited above, which is: Method And Apparatus For Feedback Of Trainline Status To The Central Processor Of A Locomotive Throttle Controller.

While a presently preferred embodiment of the invention has been described in considerable detail above, with particular reference to the attached drawing figure, it should be understood that various other adaptations and modifications of the invention can be envisioned by those persons who are skilled in the art without departing from the spirit or scope of the appended claims.

We claim:

1. A solid state relay module for on/off switching of a high voltage, high power load current to an electrical load, said solid state relay module comprising:

(a) means for receiving a first on/off control signal;

(b) means for generating a second on/off control signal based on said first on/off control signal, said second on/off control signal protected from high voltage transients;

(c) means triggered by said second on/off control signal for generating a third on/off control signal, said third on/off control signal having on and off voltages referenced to a power source for said solid state relay module;

(d) a high power semiconductor device having a first terminal for admitting said high power load current, a second terminal for outputting said high power load current, and a third terminal receiving said third on/off control signal for turning said high power load current on and off;

(e) means for sensing an overcurrent condition of said high power semiconductor device to generate a signal indicative of said overcurrent condition;

(f) a first timing means for receiving said signal indicative of said overcurrent condition to generate a signal indicative of a prolonged overcurrent condition; and (g) a means triggered by said signal indicative of a prolonged overcurrent condition for generating an override signal for overriding said second on/off control signal thereby turning said third on/off control signal to an off condition for turning said high power semiconductor device off and thereby interrupting said high power load current.

2. A solid state relay module according to claim 1 wherein said means for generating a second on/off control signal provides protection against high-voltage transients by means of an optical coupler which admits said first on/off control signal to its input to generate light which causes conduction in an output circuit which generates said second on/off control signal.

3. A solid-state relay module according to claim 1 wherein said means for generating said second on/off control signal protected from high voltage transients includes:

(I) means for generating said on/off control signal in a circuit which floats with a voltage applied to said third terminal of said semiconductor device; and (II) a diode having a property that normally it does not conduct, but conducts in an event in which a voltage across it exceeds a known value, said diode being used to limit a voltage of said second on/off control signal.

4. A solid state relay module according to claim 1 in which said semiconductor device is a MOS-Controlled Thyristor.

5. A solid state relay module according to claim 1 further characterized by having an indicator light to indicate the voltage applied to said electrical load.

6. A solid state relay module according to claim 1 wherein said first timing means includes a capacitor.

7. A solid state relay module according to claim 1 further having a second timing means which is started in an event in which said semiconductor device has been turned off due to said load current exceeding said predetermined current value; and means for turning said semiconductor device back on after said timer indicates that a predetermined time has elapsed after said semiconductor device has been turned off.

8. A solid state relay module according to claim 7 wherein said second timing means includes a capacitor.

9. A solid state relay module according to claim 1 further having means for protecting said semiconductor device from excessive reverse voltage transients.

10. The solid state relay module of claim 9 wherein said means for protecting comprises a semiconductor diode in series with said semiconductor device, said semiconductor diode having an anode side and a cathode side, said anode side receiving said load current from said semiconductor device, and said cathode side supplying said load current to said electrical load.

11. A method of switching a high-voltage, high-power load current to an electrical load based on a low-voltage, low-power first digital signal, while protecting equipment from high-voltage transients, which comprises the following steps:

(a) passing said first digital signal through the photoemitter side of an optical isolator;

(b) using the photodiode side of the optical isolator for on/off control of a second digital signal;

(c) using said second digital signal to control the gate of a high power semiconductor device;

(d) applying a high voltage to a power input of said high power semiconductor device;

(e) obtaining said high-voltage, high-power load current from an output of said high power semiconductor device;

(f) sensing said high-power load current to determine an overcurrent condition;

(g) timing said overcurrent condition to determine a prolonged overcurrent condition; and (h) in an event of a prolonged overcurrent condition, overriding said second digital signal and turning said high power semiconductor device to an off condition.

12. A method according to claim 11 further protecting said high power semiconductor device from reverse voltage transients by placing a semiconductor diode in series with the output of said high power semiconductor device.

13. A method according to claim 11 further including passing a current supplied to a power input of said high power semiconductor device through a resistor, obtaining a voltage drop across said resistor, and using it to override said second digital signal and put said high power semiconductor device in a non-conducting state.

14. A method according to claim 11 further having a step of protecting said high power semiconductor device from damage by controlling the maximum and minimum voltages applied to its gate.

15. A method according to claim 14 wherein said step of controlling the maximum and minimum voltages applied to the gate of said high power semiconductor device includes generating said voltages in a circuit which floats in relation to the voltage of a power input of said highpower semiconductor device.

16. A method according to claim 14 wherein said step of controlling the maximum and minimum voltages applied to the gate of said high power semiconductor device includes use of a diode biased in its reverse direction, which for a small reverse voltage, does not conduct, but which does conduct when said reverse voltage exceeds a known value.

\* \* \* \* \*

UNITED STATES PATENT AND TRADEMARK OFFICE
CERTIFICATE OF CORRECTION

PATENT NO. : 5,537,285
DATED : July 16, 1996
INVENTOR(S) : Robert J. Jenets et al.

It is certified that error appears in the above-indentified patent and that said Letters Patent is hereby corrected as shown below:

Column 3, line 25, delete "(2)" and insert --(3)--.

Column 5, line 34, delete "noninverting" and insert --non-inverting--.

Column 6, line 27, delete "(VA+" and insert --(VA+)--.

Signed and Sealed this

Twenty-second Day of October, 1996

Attest:

BRUCE LEHMAN

*Attesting Officer*  *Commissioner of Patents and Trademarks*